United States Patent
Lambruschi et al.

(10) Patent No.: US 6,856,193 B2
(45) Date of Patent: Feb. 15, 2005

(54) ELECTRONIC CIRCUIT FOR CONVERTING A SIGNAL AND AMPLIFIER INCORPORATING SAME

(76) Inventors: René Lambruschi, c/o Lejars Benoit, 9 Rue Voltaire, La Garenne-Colombes (FR), F-92250; Nicola Lomuto, 40 Rue Brassat, Colombes (FR), F-92700

( * ) Notice: Subject to any disclaimer, the term of this patent is extended or adjusted under 35 U.S.C. 154(b) by 20 days.

(21) Appl. No.: 10/333,064

(22) PCT Filed: Jul. 26, 2001

(86) PCT No.: PCT/FR01/02444
§ 371 (c)(1),
(2), (4) Date: Jan. 16, 2003

(87) PCT Pub. No.: WO02/11280
PCT Pub. Date: Feb. 7, 2002

(65) Prior Publication Data
US 2004/0027196 A1 Feb. 12, 2004

(30) Foreign Application Priority Data
Jul. 27, 2000 (FR) .............................................. 00/09818

(51) Int. Cl.$^7$ ................................................. H03F 3/38
(52) U.S. Cl. ..................................... 330/10; 330/207 A
(58) Field of Search ............................... 330/10, 207 A, 330/251

(56) References Cited

U.S. PATENT DOCUMENTS

| 4,531,096 A | * | 7/1985 | Yokoyama | 330/10 |
| 6,294,954 B1 | * | 9/2001 | Melanson | 330/10 |
| 6,489,841 B2 | * | 12/2002 | Takagishi | 330/10 |
| 6,577,186 B2 | * | 6/2003 | Berkhout | 330/10 |

FOREIGN PATENT DOCUMENTS

EP      1 003 280 A2     5/2000

* cited by examiner

*Primary Examiner*—Henry Choe
(74) *Attorney, Agent, or Firm*—Young & Thompson

(57) ABSTRACT

An electronic circuit for the conversion of an input electric signal (In) comprises:
- at least two transistors (4, 5) of complementary polarities and mounted with a common drain,
- control elements (2) for the transistors (4, 5) adapted to generate a single control signal (13) for the grids of the transistors (4, 5), an output line (14) connected to the sources of the transistors. The invention also relates to a power amplifier with cutting out of the voltage control, including this circuit.

8 Claims, 1 Drawing Sheet

ELECTRONIC CIRCUIT FOR CONVERTING A SIGNAL AND AMPLIFIER INCORPORATING SAME

The present invention relates in the first instance to an electronic circuit for conversion of an input electric signal.

It also relates to a power amplifier with cutting out of the voltage control.

The invention will find its application particularly in the field of the conversion of electric signal levels.

In particular, the amplification of high fidelity audio signals will be possible by using the present invention as well as the control of various electrical equipment, particularly in the field of robotic motorization.

In the field of radio amplification, the present amplifiers essentially are according to one of the two following technologies.

The first consists in using two complementary MOSFET (transistor in the field of technology of silicon metal oxide) mounted with a common source.

Although permitting attaining good results with audio quality material, such mountings do not permit obtaining important power gain.

A second technology consists in using two MOSFET transistors both with a N channel arranged in totem pole mounting.

One of these transistors is mounted with a common drain and the other is mounted with a common source.

This type of mounting is quite successful at present in the field of high fidelity for class D audio amplifiers (amplifier with cutout power).

Such a totem pole mounting however has a major drawback as to the control of the transistors.

Thus, the grids of each N channel MOSFET transistor must be controlled by two signals from different sources.

Because of this, problems of synchronization of the control signals arise. Given that the simultaneity of their occurrence is impossible to achieve in practice, there are noted current peaks during switching.

Thus, it can happen with this mounting that the two transistors will be, for a short time, simultaneously active, which sometimes gives rise to current peaks that can attain several hundreds of amperes.

Of course, these large current peaks are damaging both from the standpoint of output of the system and as to its reliability.

To avoid the presence of current peaks during switching, there is at present used a dead time at the moment of this switching.

There are thus avoided current peaks, but other drawbacks arise.

Thus, the insertion of a dead time leads to distortions in the useful signal.

Moreover, the dead time does not solve the problem of intrinsic disequilibrium of the totem pole configuration: the mounting of the transistors is not symmetrical because one is mounted with a common drain and the other with a common source.

As a result, present amplifiers do not give complete satisfaction because they do not permit finding a satisfactory compromise, between the output of the system and the reliability obtained during amplification.

In technologies related to those set forth above, there is known from the document FR-A-2.779.293 an output circuit with a transistor which has a voltage higher than a breakdown voltage of two NMOS and PMOS transistors used to construct the output circuit which are connected in series and which have their grids connected to each other. A voltage control circuit is connected to the grids and to the sources of these transistors. The voltage control circuit receives energy from supplies of high and low voltage. The voltage control circuit applies an intermediate reference voltage to the grids of the transistors. Then, in response to an input signal, the voltage control circuit controls the voltages applied to the sources of the transistors.

This mounting does not give real progress relative to the totem pole mounting, given that two control signals are still necessary.

Moreover, it relates only to a mounting with a common source.

The present invention has for its object to overcome the drawbacks of the present devices and, in the first instance to provide a circuit ensuring both high amplification output and high quality of the obtained signal.

One of the principal advantages of the invention is to have a single source of control for the grid so as to avoid the problems of switching.

There will thus not occur, or only slightly occur, the phenomenon of current peaks.

Because of this, the losses are considerably reduced at this level without generating distortion as is the case with the insertion of a dead time.

The losses being substantially reduced, it is possible to envisage broad applications with the present invention to obtain very high outputs whilst integrating the device in the form of modules or hybrid circles of small size and hence with a high ratio of power to volume with better dynamic characteristics.

Another advantage of the invention is to provide control means which form the control source for the grids and transistors without having recourse to an insulating transformer.

As a result, there no longer arise the limitations occasioned by the use of an insulating transformer and there is rendered possible an unlimited advance in the cyclic ratio.

It will be understood that the advantages thus set forth permit envisaging multiple uses of the present invention.

Other objects and advantages will become apparent from the description which follows, which is however given only by way of indication and is not limiting of the invention.

The present invention relates to an electronic circuit for conversion of an input electrical signal, comprising:
   at least two transistors of complementary polarities and mounted in the common drain,
   control means for the transistors adapted to generate a single control signal for the grids of said transistors,
   an output line connected to the sources of said transistors.
There are set forth hereafter various modifications envisaged for this circuit:
   the complementary transistors are field effect transistors of the MOS technology, one with a N channel, the other with a P channel.
   the circuit comprises a modulator of pulse width adapted to convert the input signal into a signal of modulated pulse width usable by the control means.
   the control means comprise a buffer circuit generating a control signal and supplied by a high voltage supply and a reference voltage supply.
   the reference voltage supply is the output line.
   the control means comprise a level translator constituted by a comparator connected at the input to the pulse width modulator such that its input inverter receives the signal (PWM) such that its inverting input receives the (PWM) signal and its non-inverting input receives the reverse of the (PWM) signal, and connected at the output to the input of the buffer circuit.

the comparator has a high voltage supply constituted by the high voltage supply and a low voltage supply constituted by the output line.

the control means comprise at the output a polarization network connected at the output to a DC generator and to the grids of the transistors.

the connection between the grids of the transistors, at the output of the polarization network, is effected by a passive level adaptation network.

it comprises a filter for filtering the output signal.

The invention also relates to a power amplifier with cutting out of the voltage control, including a circuit according to the invention.

The accompanying drawings are given by way of indicative and non-limiting examples. They represent a preferred embodiment according to the invention. They permit easy comprehension of the invention.

The amplifier provided by the present invention is of the D class type, with cutting out of the voltage control.

The circuit in its embodiment comprises at least two transistors ensuring the conversion of the input signal level In.

Although field effect transistors of the MOS (Metal Oxide Silicon) technology are particularly envisaged, the invention is not limited at this level and other types of transistors (bipolar, IGBT, quantum for example) could be used.

There will be described hereafter the preferred embodiment in which the transistors are field effect of the MOS technology, hereinafter called MOSFET.

In a known manner with respect to D class amplifiers, the signal to be amplified is received in the circuit at a pulse width modulator 1.

Figure 1:
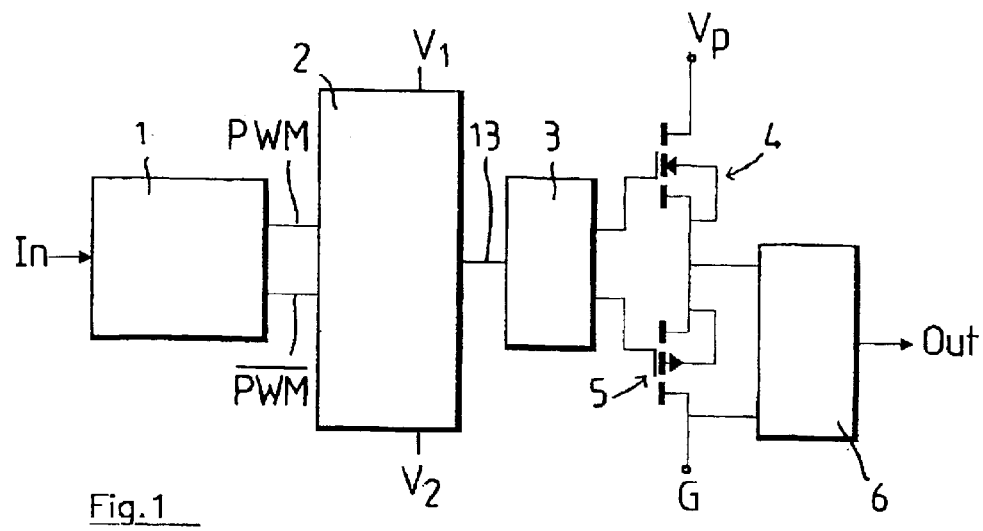
FIG. 1 is a general operating scheme of the electronic circuit shown here.

As shown in FIG. 1, the modulator 1 generates a square signal with pulse width modulation (PWM).

In the case of the invention, this PWM signal and its $\overline{PWM}$ complement obtained by any known inversion means constitute the input of the control means shown at 2 in FIG. 1.

Schematically, this figure illustrates that, with the PWM and $\overline{PWM}$ signals as well as, thanks to high and low voltage supplies $V_1$ and $V_2$, the control means 2 form at the output a control signal 13.

The control signal 13 ensures control of the grids of the two transistors designated at 4 and 5.

Possibly, a passive network 3 connects the two grids so as to provide a new adaptation.

The transistors 4, 5 are of complementary polarities.

In the case of MOSFET, one is of the N 4 channel type and the other of the P 5 channel type.

The power supply is constituted between a high voltage $V_p$ connected to the drain of the transistor 4 and the ground G, connected to the drain of the transistor 5.

At the output, a filter 6 is desirable. As at present in an audio application, it is a low pass filter of capacito-inductive composition.

It will be noted that, according to the invention, the signal 13 is the only control signal of the grids of the transistors 4, 5. There is thus solved the problem of switching peaks, mentioned previously.

Moreover, it will be seen that the output line 14 is connected to the transistor sources 4, 5.

The output signal obtained by this circuit is indicated in FIG. 1 by the term "out".

There will be described hereafter more precisely the particular mode of embodiment of the invention shown in FIG. 2.

A preferred example of the control means 2 is shown there.

Within the control means 2, a buffer circuit 10 permits the formation of a compatible control signal.

It receives at the input a signal of modulated pulse width. Its supply is constituted by a high voltage source $V_1$ and a reference voltage.

In a manner characteristic of the invention, the reference voltage is taken on the output line 14. The buffer circuit 10 is thus connected to the node N1 common to the two sources of transistors 4, 5.

At the output of the buffer circuit 10, a polarization network 12 is present. It permits fixing the static operating point of the circuit.

At its output, the node N2 connects the grids of the transistors 4, 5. The generator 11 delivers to them a DC electrical signal and emplaces the low voltage V2 of the control supply. Another advantage of the circuit provided here is, according to a preferred modification, the use of a transistor of a particular design.

Figure 2:
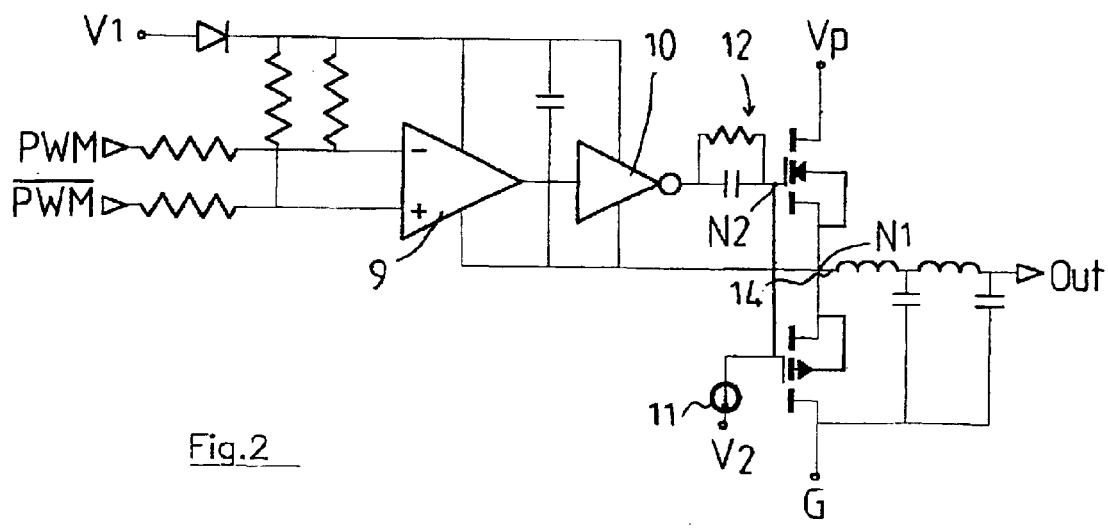
FIG. 2 is a preferred embodiment of this circuit according to one example.

To this end, the control means 2 comprise, upstream of the buffer circuit 10, a comparator 9 as shown in FIG. 2.

As shown, the supply of the comparator 9 will be similar to or derived from that of the buffer circuit 10, between a high voltage $V_1$ and the reference voltage constituted by the output line 14.

The inverting and non-inverting inputs of the comparator receive respectively the signals PWM and $\overline{PWM}$.

The use of such a network to form the translation of the level is advantageous relative to the use of an insulating transformer because it permits unlimited excursion of the cyclic ratio.

It will be noted that the circuit according to the invention and the amplifier including it can have a particularly reduced size with regard to the possibilities of amplification that are offered. FIG. 2 also shows an embodiment of the filter 6.

REFERENCES

1. Pulse width modulator
2. Control means
3. Network for connection of grids
4. Transistor
5. Transistor
6. Filter
7, 8. Inputs of the control means
9. Comparator
10. Buffer
11. Generator
12. Polarization network
13. Control signal
14. Output line
in: input signal
out: output signal
$V_1$: high voltage of control supply
$V_2$: low voltage of control supply
$V_p$: high voltage of the power source
G: ground power
N1: node 1

N2: node 2

PWM: pulse width modulated signal

What is claimed is:

1. Electronic circuit for the conversion of an input electrical signal (In), comprising:

at least two transistors of complementary polarities and mounted with a common drain, control means (2) for the transistors adapted to generate a single control signal (13) for the grids of said transistors, an output line (14) connected to the sources of said transistors, characterized by the fact that the control means comprise a buffer circuit (10) adapting a control signal and supplied by a high voltage supply ($V_1$) and by a reference voltage supply and that the reference voltage supply is the output line (14).

2. Circuit according to claim 1, characterized by the fact that it comprises a pulse width modulator (1) adapted to convert the input signal (In) into a pulse width modulated (PWM) signal usable by the control means (2).

3. Circuit according to claim 1, characterized by the fact that the control means comprise a level translator constituted by a comparator (9) connected at the input to the pulse width modulator (1) such that its inverting input receives the $\overline{PWM}$ signal and its non-inverting input receives a PWM signal which is the reverse of the PWM signal, and connected at the output to the input of the buffer circuit (10).

4. Circuit according to claim 3, characterized by the fact that the comparator (9) has a high voltage supply constituted by the high voltage supply $V_1$ and a low voltage supply constituted by the output line (14).

5. Circuit according to claim 1, characterized by the fact that the control means comprise at the output a polarization network (12) connected at the output to a DC voltage generator (11) and to the grids of the transistors.

6. Circuit according to claim 5, characterized by the fact that the connection between the grids of the transistors, at the output of the polarization network (12), is by means of a level adaptation network (3).

7. Circuit according to claim 1, characterized by the fact that it comprises a filter (6) for filtering the output signal (out).

8. Power amplifier with cutting out of the voltage control, characterized by the fact that it includes the circuit according to claim 1.

* * * * *